(12) United States Patent
Kwon et al.

(10) Patent No.: US 11,811,095 B2
(45) Date of Patent: Nov. 7, 2023

(54) BATTERY PACK INCLUDING BUSBAR ASSEMBLY HAVING FLEXIBLE SUBSTRATE AND INSULATING FILM

(71) Applicant: SAMSUNG SDI CO., LTD., Yongin-si (KR)

(72) Inventors: Young Hwan Kwon, Yongin-si (KR); Jae Pil Ahn, Yongin-si (KR); Chul Jung Yun, Yongin-si (KR); Baeck Gi Jung, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 48 days.

(21) Appl. No.: 17/524,856

(22) Filed: Nov. 12, 2021

(65) Prior Publication Data

US 2022/0173484 A1 Jun. 2, 2022

(30) Foreign Application Priority Data

Nov. 30, 2020 (KR) .................. 10-2020-0164707

(51) Int. Cl.
*H01M 50/526* (2021.01)
*H01M 50/569* (2021.01)
*H01M 50/505* (2021.01)
*H01M 50/503* (2021.01)
*H01M 10/48* (2006.01)
(Continued)

(52) U.S. Cl.
CPC ....... *H01M 50/526* (2021.01); *H01M 10/482* (2013.01); *H01M 10/486* (2013.01); *H01M 50/503* (2021.01); *H01M 50/505* (2021.01); *H01M 50/569* (2021.01); *H02G 5/005* (2013.01); *H01M 10/425* (2013.01); *H01M 50/507* (2021.01); *H01M 50/519* (2021.01)

(58) Field of Classification Search
CPC ............. H01M 50/526; H01M 50/569; H01M 50/505; H01M 50/503; H01M 50/519; H01M 50/507; H01M 10/482; H01M 10/486; H01M 10/425; H02G 5/005
See application file for complete search history.

(56) References Cited

U.S. PATENT DOCUMENTS

| 2020/0136119 A1 | 4/2020 | Weinberger et al. |
| 2020/0203941 A1 | 6/2020 | Ing et al. |
| 2021/0122230 A1 | 4/2021 | Shidara et al. |

FOREIGN PATENT DOCUMENTS

| CN | 109103405 A | 12/2018 |
| JP | 5363150 B2 | 12/2013 |

(Continued)

OTHER PUBLICATIONS

EPO machine generated English translation of JP-2021077568-A (Year: 2021).*

(Continued)

*Primary Examiner* — Christopher P Domone
*Assistant Examiner* — Kimberly Wyluda
(74) *Attorney, Agent, or Firm* — Lee IP Law, P.C.

(57) ABSTRACT

A battery pack includes battery cells arranged in a first direction, and a busbar assembly coupled to upper portions of the battery cells, the busbar assembly having a busbar electrically connected to the battery cells, a flexible substrate configured to measure a state information of the battery cells, and an insulating film surrounding the busbar and the flexible substrate.

13 Claims, 7 Drawing Sheets

(51) Int. Cl.
*H02G 5/00* (2006.01)
*H01M 10/42* (2006.01)
*H01M 50/507* (2021.01)
*H01M 50/519* (2021.01)

(56) References Cited

FOREIGN PATENT DOCUMENTS

| JP | 2019-075358 A | | 5/2019 |
| JP | 2021077568 A | * | 5/2021 |
| KR | 10-1723037 B1 | | 4/2017 |
| WO | WO 2020/022057 A1 | | 1/2020 |

OTHER PUBLICATIONS

EPO machine generated English translation of CN-109103405-A (Year: 2018).*
Extended European Search Report dated Apr. 7, 2022 for corresponding European Patent Application No. 21209873.5.

* cited by examiner

BATTERY PACK INCLUDING BUSBAR ASSEMBLY HAVING FLEXIBLE SUBSTRATE AND INSULATING FILM

CROSS-REFERENCE TO RELATED APPLICATION

This application claims priority to and the benefit of Korean Patent Application No. 10-2020-0164707, filed on Nov. 30, 2020, in the Korean Intellectual Property Office, the contents of which in its entirety are herein incorporated by reference.

BACKGROUND

1. Field

Embodiments of the present disclosure relate to a battery pack.

2. Description of the Related Art

In general, unlike primary batteries which are not rechargeable, a secondary battery can be discharged and charged. The secondary battery is used as an energy source of, e.g., a mobile device, an electric vehicle, a hybrid vehicle, an electric bicycle or an uninterruptible power supply (UPS). According to the type of external device used with the batteries, a single secondary battery may be used or a battery module or pack, in which a plurality of batteries are bundled up by electrically connecting the batteries, may be used.

Small mobile devices, e.g., cell phones, can be operated for a certain period of time with the output and capacity of a single battery. However, when long-time operation and high-power operation are required, e.g., in electric vehicles or hybrid vehicles that consume a lot of power, a battery module or pack including a large number of batteries is preferred, so the output voltage or output current can be increased according to the number of built-in batteries.

SUMMARY

The battery pack according to embodiments may include battery cells arranged in a first direction, and a busbar assembly coupled to upper portions of the battery cells, the busbar assembly having a busbar electrically connected to the battery cells, a flexible substrate configured to measure a state information of the battery cells, and an insulating film surrounding the busbar and the flexible substrate.

The insulating film may include a first insulation film located on the upper portion of the busbar and the flexible substrate, and a second insulation film located on the lower portion of the busbar and the flexible substrate.

The busbar may include a body and a connection part extending to one side of the body and coupled to the electrode terminal of the battery cell, and each of the first insulation film and the second insulation film includes a terminal hole exposing the connection part.

The flexible substrate may include a temperature measuring unit for measuring the temperature of the battery cell, and a sensing plate for measuring the voltage of the battery cell, and each of the first insulation film and the second insulation film may include a first hole exposing the temperature measurement unit.

The first insulation film may include a second hole exposing a portion of the sensing plate.

The battery pack may further include a third insulation film positioned between the first insulation film and the second insulation film.

The busbar may include a first busbar located between the first insulation film and the third insulation film, and a second busbar located between the third insulation film and the second insulation film.

The busbar may include a body and a connection part extending to one side of the body and coupled to the electrode terminal of each of the battery cells, and the second busbar may further include a bent portion located between the body and the connection part.

The height of the bent portion may correspond to the thickness of the third insulation film.

The third insulation film may be formed to have a smaller area than the first insulation film and the second insulation film, and may be located between the body of the first busbar and the body of the second busbar.

The flexible substrate may include a sensing plate for measuring the voltage of the battery cells, and the sensing plate may include a first sensing plate electrically connected to the first busbar and a second sensing plate electrically connected to the second busbar.

The third insulation film may include a through-hole exposing a portion of the second sensing plate.

The second sensing plate may be electrically connected to the body of the second busbar through the through-hole.

The bent portion of the second sensing plate may be formed to have a larger height than the bent portion of the first sensing plate.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
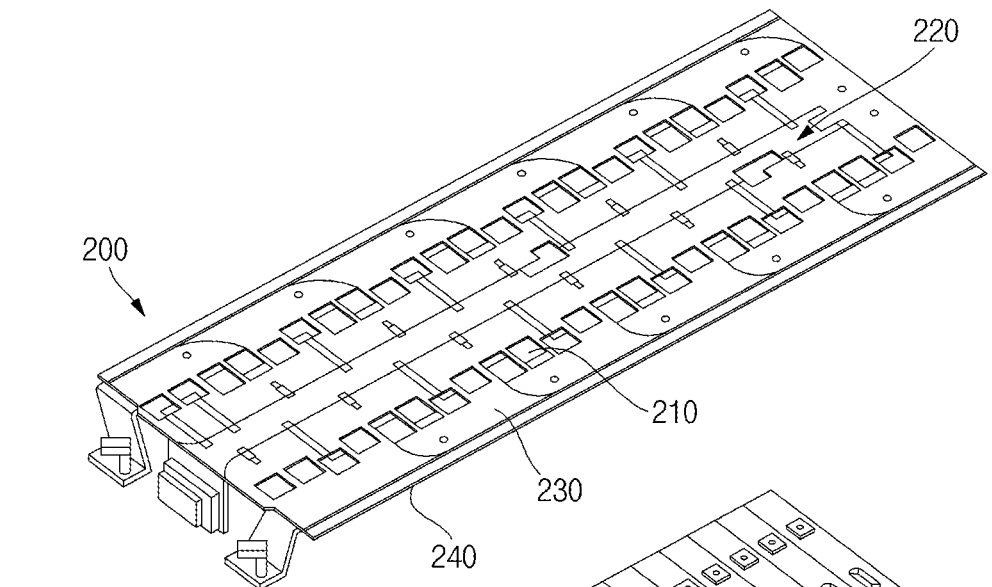
FIG. 1 is an exploded perspective view of a battery pack according to an embodiment of the present disclosure.
Figure 1:
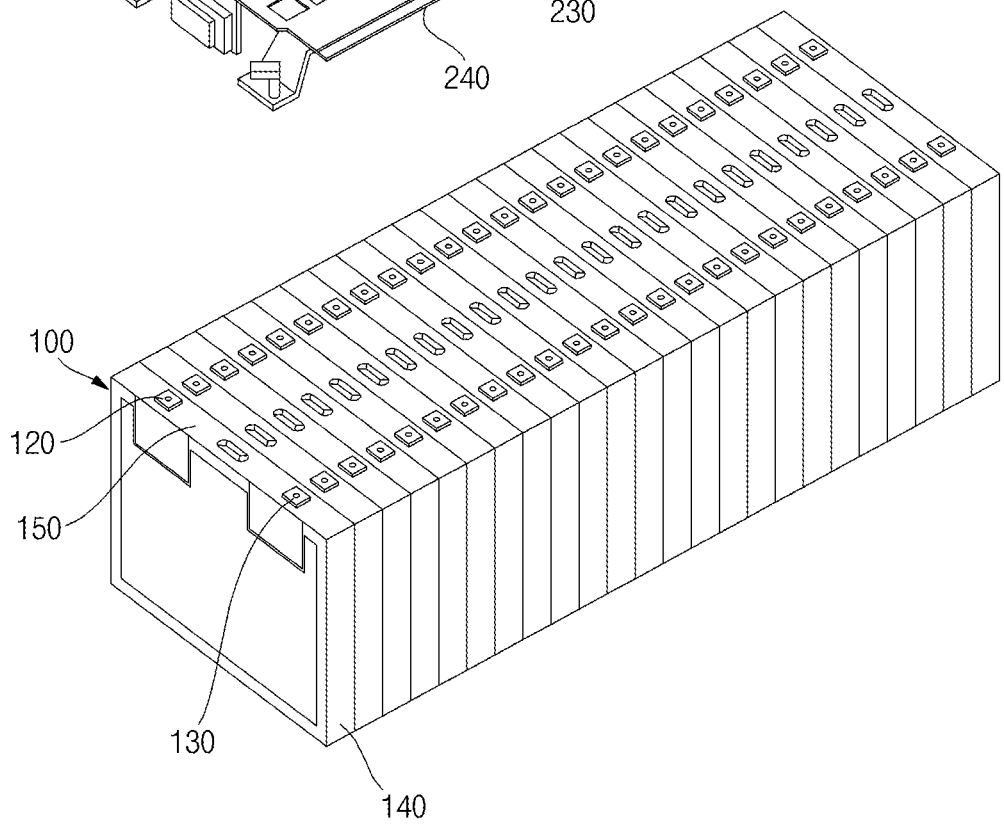

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

As used herein, the term "and/or" includes any and all combinations of one or more of the associated listed items. In addition, it will be understood that when an element A is referred to as being "connected to" an element B, the element A can be directly connected to the element B or an intervening element C may be present therebetween such that the element A and the element B are indirectly connected to each other.

As used herein, the singular forms are intended to include the plural forms as well, unless the context clearly indicates otherwise. It will be further understood that the terms that the terms "comprise or include" and/or "comprising or including," when used in this specification, specify the presence of stated features, numbers, steps, operations, elements, and/or components, but do not preclude the presence or addition of one or more other features, numbers, steps, operations, elements, components, and/or groups thereof.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the element or feature in the figures is turned over, elements described as "below" or "beneath" other elements or features would then be oriented "on" or "above" the other elements or features. Thus, the exemplary term "below" can encompass both an orientation of above and below.

Figure 2:
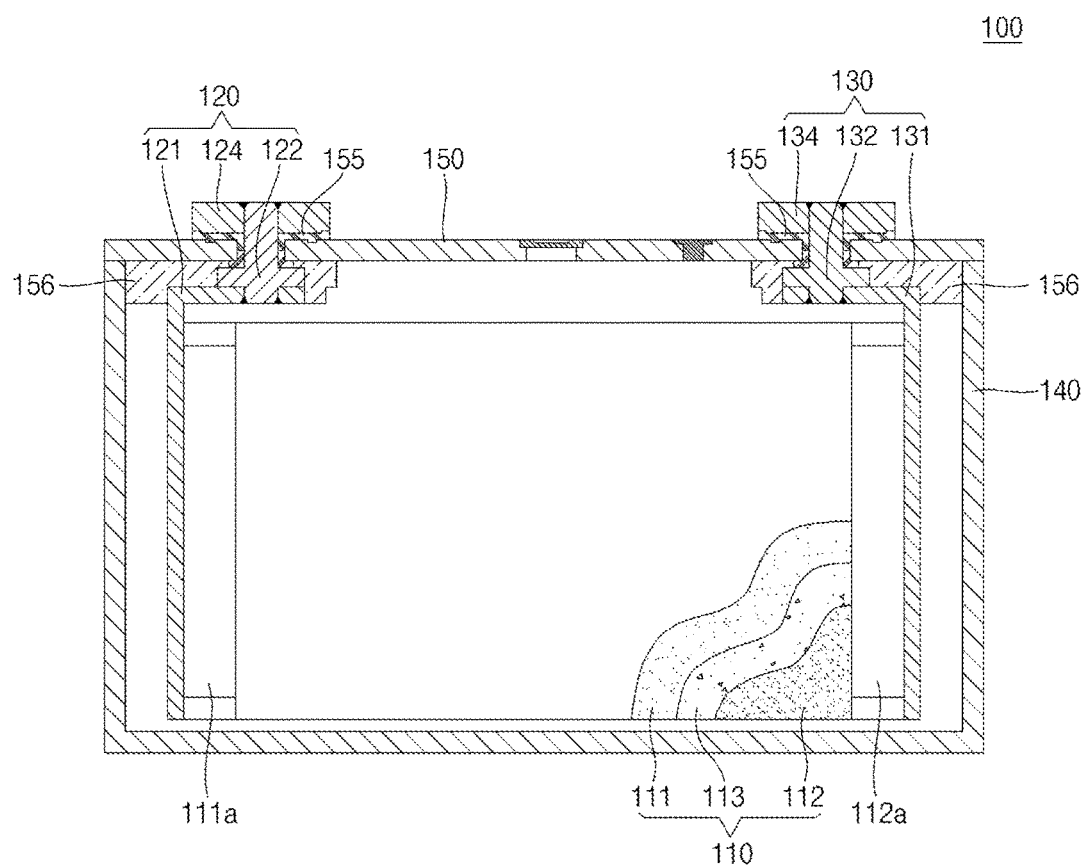
FIG. 2 is a cross-sectional view of a battery cell in the battery pack of FIG. 1.
Figure 3:
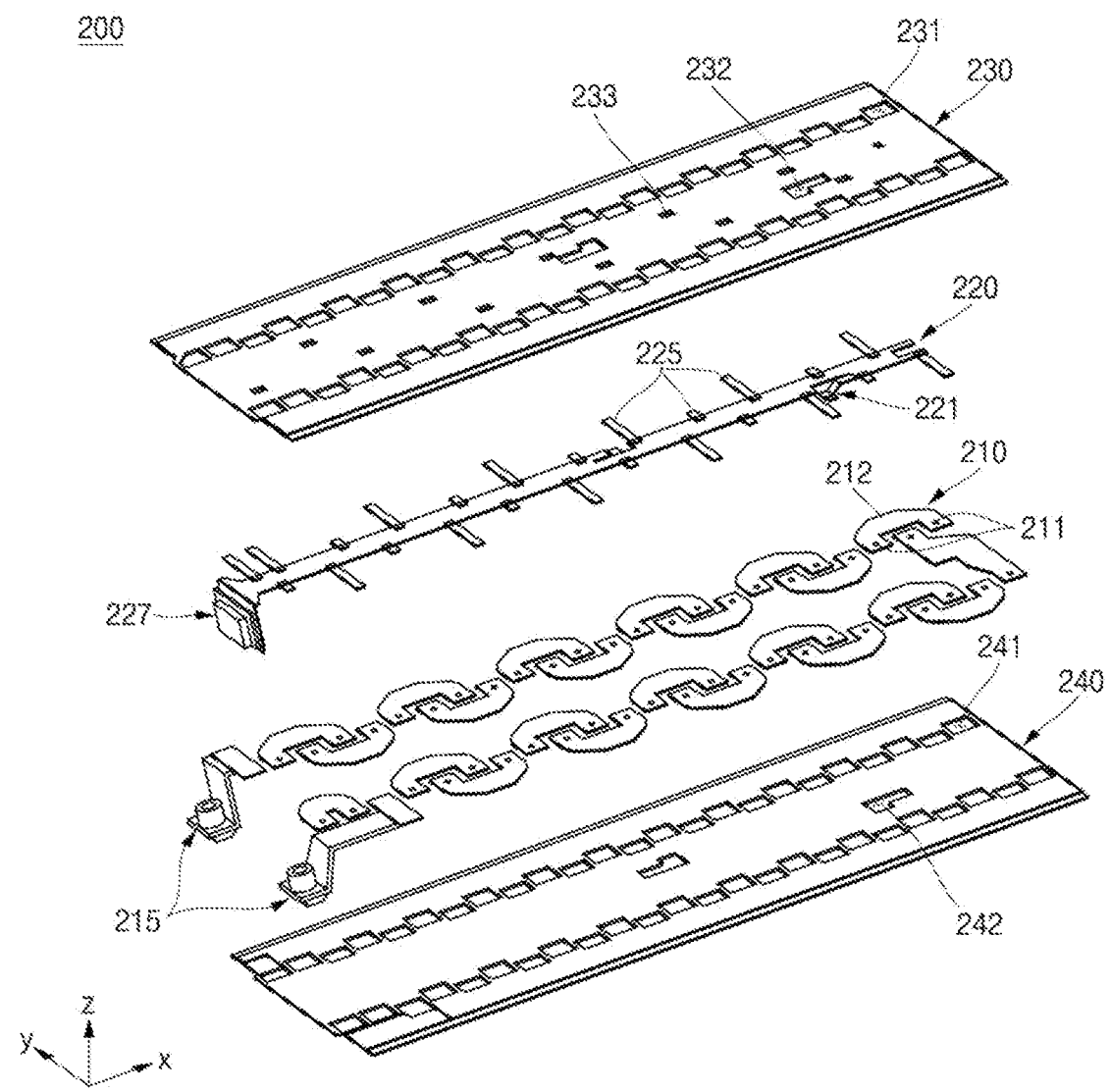
FIG. 3 is an exploded perspective view of a busbar assembly in the battery pack of FIG. 1.

FIG. 1 is an exploded perspective view of a battery pack according to an embodiment. FIG. 2 is a cross-sectional view of a battery cell of FIG. 1, and FIG. 3 is an exploded perspective view of a busbar assembly of FIG. 1.

Referring to FIG. 1, a battery pack 10 according to an embodiment of the present disclosure may include a plurality of battery cells 100 arranged in one direction and a busbar assembly 200. The busbar assembly 200 may be arranged above the plurality of battery cells 100, e.g., the busbar assembly 200 may continuously overlap tops of all the plurality of battery cells 100.

Referring to FIG. 2, each of the battery cells 100 may include an electrode assembly 110, a first terminal 120, a second terminal 130, a case 140, and a cap plate 150. The electrode assembly 110 may be arranged in the case 140, with the cap plate 150 sealing the case 140, and the first and second terminals 120 and 130 extending from the electrode assembly 110 through the cap plate 150.

The electrode assembly 110 may be formed by stacking a stack of a first electrode plate 111, a separator 113, and a second electrode plate 112, e.g., formed in a thin plate shape or a film shape. This type of electrode assembly 110 may be referred to as a stack type. In some examples, the first electrode plate 111 may serve as a negative electrode, and the second electrode plate 112 may serve as a positive electrode, or vice versa.

In some examples, the first electrode plate 111 may be formed by coating a first electrode active material, e.g., graphite or carbon, on a first electrode current collector made of a metal foil, e.g., copper, copper alloy, nickel or nickel alloy. The first electrode plate 111 may include a first electrode uncoated region 111a which is an area to which the first electrode active material is not applied. In some examples, the second electrode plate 112 may be formed by coating a second electrode active material, e.g., a transition metal oxide, on a second electrode current collector made of a metal foil, e.g., aluminum or an aluminum alloy. The second electrode plate 112 may include a second electrode uncoated region 112a that is an area to which the second electrode active material is not applied. The first electrode uncoated region 111a may protrude to one side of the electrode assembly 110, and the second electrode uncoated region 112a may protrude to the other side of the electrode assembly 110. The separator 113 may be positioned between the first electrode plate 111 and the second electrode plate 112 to prevent a short circuit and to enable the movement of lithium ions, and may include, e.g., polyethylene, polypropylene, or a composite film of polyethylene and polypropylene.

The first terminal 120 may be formed of a metal and may be electrically connected to the first electrode plate 111. In some examples, the first terminal 120 may include a first current collecting plate 121, a first terminal pillar 122, and a first terminal plate 124. The first current collecting plate 121 may be electrically connected to the first electrode uncoated region 111a protruding to one end of the electrode assembly 110. A terminal hole may be formed in an upper portion of the first current collecting plate 121, and the first terminal pillar 122 may be inserted into the terminal hole to be riveted and/or welded. The first terminal pillar 122 may protrude and extend upward a predetermined length through the cap plate 150, and may be electrically connected to the first current collector plate 121 under the cap plate 150. The first terminal plate 124 may be coupled to the first terminal pillar 122.

The second terminal 130 may be made of a metal and may be electrically connected to the second electrode plate 112. In some examples, the second terminal 130 may include a second current collecting plate 131, a second terminal pillar 132, and a second terminal plate 134. The second current collecting plate 131 may be electrically connected to the second electrode uncoated region 112a protruding from one end of the electrode assembly 110. A terminal hole may be formed in an upper portion of the second current collecting plate 131, and the second terminal pillar 132 may be inserted into the terminal hole to be riveted and/or welded. The second terminal pillar 132 may protrude and extend upward a predetermined length through the cap plate 150, and may be electrically connected to the second current collecting plate 131 at the lower portion of the cap plate 150. The second terminal plate 134 may be coupled to the second terminal pillar 132. The second terminal plate 134 may be electrically connected to the cap plate 150, and the cap plate 150 and the case 140 may have the same polarity (e.g., positive polarity) as the second terminal 130.

The case 140 may be made of, e.g., aluminum, an aluminum alloy, or a conductive metal such as nickel-plated steel, and has a substantially hexahedral shape in which an opening, into which the electrode assembly 110 can be inserted and seated, is formed. The cap plate 150 may be coupled to the opening of the case 140 to seal the case 140.

The cap plate 150 may seal the opening of the case 140, and may be made of the same material as the case 140. In some examples, the cap plate 150 may be coupled to the case 140 by laser welding. An upper coupling member 155 may be formed between the cap plate 150 and each of the first terminal pillar 122 and the second terminal pillar 132 on the cap plate 150. In addition, the upper coupling member 155 may be in close contact with the cap plate 150. The upper coupling member 155 may insulate the first terminal pillar 122 and the second terminal pillar 132 from the cap plate 150. In some examples, the upper coupling member 155 formed on the second terminal pillar 132 may electrically connect the second terminal plate 134 and the cap plate 150 to each other, and accordingly, the second terminal 130 may have the same polarity as the cap plate 150 and the case 140. A lower insulating member 156 may be formed between each of the first current collecting plate 121 and the second current collecting plate 131 and the cap plate 150, and short circuits between the first current collecting plate 121 and the cap plate 150 and between the second current collecting plate 131 and the cap plate 150 may be prevented.

Referring bac to FIG. 1, the busbar assembly 200 may include a busbar 210, a flexible substrate 220, a first insulation film 230, and a second insulation film 240. The busbar assembly 200 may be seated on top of the plurality of battery cells 100. The busbar 210 may electrically connect the plurality of battery cells 100

Referring to FIG. 3, the busbar 210 may connect the plurality of battery cells 100 in series and/or in parallel. The busbar 210 may include a plurality of busbars 210 to electrically connect the plurality of battery cells 100 to each other. The busbar 210 may be electrically connected to the first terminal 120 and/or the second terminal 130 of the battery cell 100. In some examples, the busbar 210 may electrically connect the battery cells 100 that are not adjacent to each other. In some examples, the busbar 210 may electrically connect the first terminal 120 of one of the battery cells 100 and the first terminal 120 or the second terminal 130 of another one of the battery cells 100. The busbar 210 may be welded to the first terminal 120 or the second terminal 130 of each of the battery cells 100. The plurality of busbars 210 may be coated or laminated with the first insulation film 230 and the second insulation film 240. In some examples, the plurality of busbars 210 may be located on the same plane between the first insulation film 230 and the second insulation film 240, e.g., tops of the busbars 210 may be coplanar with each other and bottoms of the busbars 210 may be coplanar with each other. In some examples, an output terminal 215 for drawing out the output voltage of the battery pack 10 may be formed on the busbar 210. The output terminal 215 may be drawn out from the battery pack 10 in the same direction.

For example, as illustrated in FIG. 3, each of the busbars 210 may include a body 212 and a connection part 211 that extends (or protrudes) to one side of the body 212 and is electrically connected to the first terminal 120 and/or the second terminal 130 of the battery cell 100. In some examples, the connection part 211 may include, e.g., consist of, two connection parts. The connection part 211 may be welded to the first terminal 120 or the second terminal 130 of the battery cell 100. In some examples, the connection part 211 may be welded to the first terminal plate 124 or the second terminal plate 134. For example, as illustrated in FIG. 3, top surfaces of the body 212 and the connection part 211 may be coplanar with each other, and bottom surfaces of the body 212 and the connection part 211 may be coplanar with each other to define a, e.g., completely, flat busbar 210.

For example, as further illustrated in FIG. 3, each body 212 may extend along the X-axis, and two connection parts 211 may extend, e.g., in parallel to each other, from opposite ends of the body 212 in the Y-axis. For example, referring to FIGS. 1 and 3, two rows of bodies 212 along the X-axis may be arranged to overlap the first terminals 120 of the battery cells 100, and two rows of bodies 212 along the X-axis may be arranged to overlap the second terminals 130 of the battery cells 100. For example, in each of the two rows of bodies 212, the busbars 210 may be arranged in a zigzag pattern, e.g., connection parts 211 of one of the two rows may face connection parts 211 of the other of the two rows.

The flexible substrate 220 may be positioned on top of the plurality of battery cells 100. In some examples, the flexible substrate 220 may extend in a direction in which the plurality of battery cells 100 are arranged, e.g., along the X-axis, and may be formed to pass through the center of the cap plate 150. For example, as illustrated in FIG. 3, the flexible substrate 220 may extend between the pairs of rows of the busbars 210, e.g., a width of the flexible substrate 220 in the Y-axis may fit between the pairs of rows of the busbars 210. In some examples, the flexible substrate 220 may be referred to as a flexible printed circuit assembly (FPCA) or a flexible printed circuit board (FPCB). In some examples, the flexible substrate 220 may measure status information of the battery cell 100, e.g., voltage and/or temperature, of the battery cell 100.

The flexible substrate 220 may include a temperature measuring unit 221, i.e., a temperature measurer, for measuring the temperature of the battery cell 100 and a sensing plate 225 for measuring the voltage of the battery cell 100. In some examples, the flexible substrate 220 may include a plurality of temperature measuring units 221 and a plurality of sensing plates 225 to measure the temperatures and voltages of various parts of the plurality of battery cells 100. The temperature measuring unit 221 may directly contact the battery cell 100 to measure the temperature of the battery cell 100. In some examples, the temperature measuring unit 221 may include a temperature sensor, e.g., a thermistor, and a connection plate welded to the battery cell 100. For example, the temperature measuring unit 221 may sense the temperature of the battery cell 100 by measuring a resistance value of the temperature sensor, i.e., the thermistor. In addition, a connector 227 may be coupled to one end of the flexible substrate 220, and the flexible substrate 220 may be connected to an external system through the connector 227.

The first insulation film 230 and the second insulation film 240 may complete the busbar assembly 200 by laminating, e.g., surrounding or encapsulating, the busbar 210 and the flexible substrate 220. The first insulation film 230 may be coupled from the top of the busbar 210 and the flexible substrate 220, and the second insulation film 240 may be coupled from the bottom of the busbar 210 and the flexible substrate 220. For example, as illustrated in FIG. 3, the first insulation film 230 may extend continuously above the busbar 210 and the flexible substrate 220, and the second insulation film 240 may extend continuously below the busbar 210 and the flexible substrate 220. In some examples, after the busbar 210 and the flexible substrate 220 are positioned between the first insulation film 230 and the second insulation film 240, the first insulation film 230 and the second insulation film 240 are thermally fused to form the busbar assembly 200, e.g., so the busbar 210 and the flexible substrate 220 may be embedded within the fused, e.g., laminated, structure of the first and second insulation films 230 and 240.

In some examples, the first insulation film 230 and/or the second insulation film 240 may include, e.g., a polyethylene terephthalate (PET) film, a polyimide (PI) film, a polyethylene naphthalate (PEN) film, or a polycarbonate (PC) film. The first insulation film 230 and/or the second insulation film 240 may be any film or sheet including an insulating material.

The first insulation film 230 and the second insulation film 240 may include terminal holes 231 and 241 formed at positions corresponding to the first terminal plate 124 and the second terminal plate 134 of the battery cell 100, respectively. For example, referring to FIG. 3, edges of the first insulation film 230 and the second insulation film 240 along the X-axis may be completely fused with each to surround the busbars 210, such that only the terminal holes 231 and 241 may expose portions of the busbars 210. In addition, the terminal holes 231 and 241 may expose the connection part 211 of the busbar 210 electrically connected to the first terminal plate 124 or the second terminal plate 134. The first insulation film 230 may include a first hole 232 exposing the temperature measuring unit 221 and a second hole 233 exposing a portion of the sensing plate 225 for measuring a voltage. The first insulation film 230 may cover the remaining portion except for the portion exposed by the second hole 233 in the sensing plate 225, thereby preventing the sensing plate 225 from being corroded and preventing a short circuit from occurring between the sensing plate 225 and an external circuit. That is, the first insulation film 230 may have the same effect as coating the surface of the sensing plate 225. In addition, the first insulation film 230 may prevent unnecessary short circuit between the busbar 210 and an external component.

The second insulation film 240 may include a first hole 242 exposing the temperature measuring unit 221. The first hole 232 of the first insulation film 230 and the first hole 242 of the second insulation film 240 are formed at the same location, e.g., the first and second holes 232 and 242 may vertically overlap each other. Here, the second insulation film 240 is located under the busbar 210 and the flexible substrate 220, and thus a second hole exposing the sensing plate 225 is not necessarily formed. The second insulation film 240 may insulate the busbar 210 and the cap plate 150 from each other.

As described above, the busbar assembly 200 may be completed by positioning the busbar 210 and the flexible substrate 220 between the first insulation film 230 and the second insulation film 240 and thermally fusing the first insulation film 230 and the second insulation film 240. Therefore, in the battery pack 10 according to embodiments, a separate holder or support member for fixing the busbar 210 and the flexible substrate 220 is not required, thereby reducing costs. In addition, in the battery pack 10 according to embodiments, by fixing the busbar 210 and the flexible substrate 220 by using the first insulation film 230 and the second insulation film 240 that are relatively thinner than a holder or a support member, the volume, i.e., the height (e.g., along the Z-axis), of the battery pack 10 can be reduced, thereby increasing the energy density (or capacity per unit volume).

Figure 4:
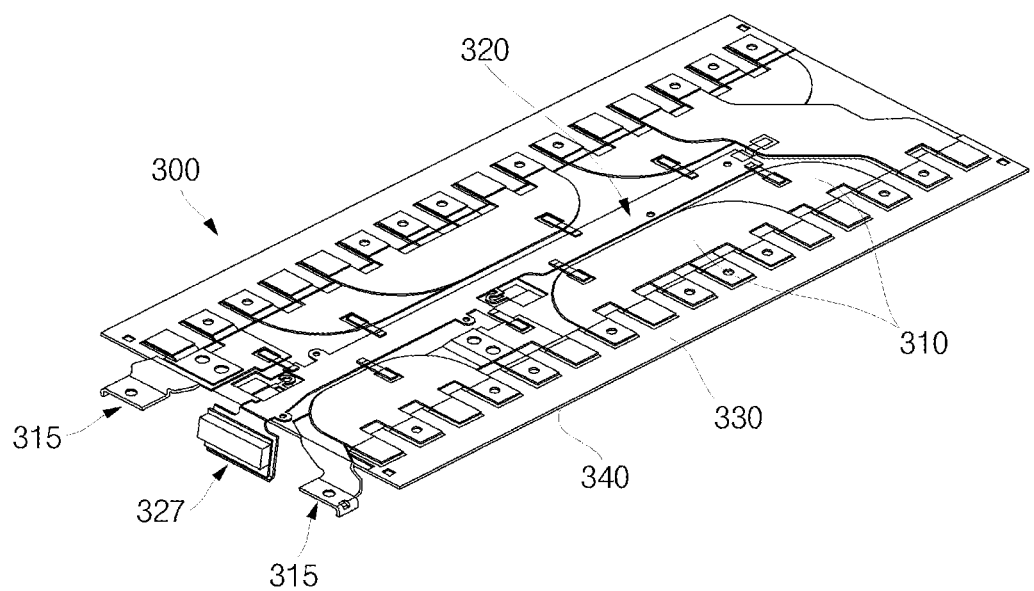
FIG. 4 is a perspective view of a busbar assembly in a battery pack according to another embodiment.
Figure 5:
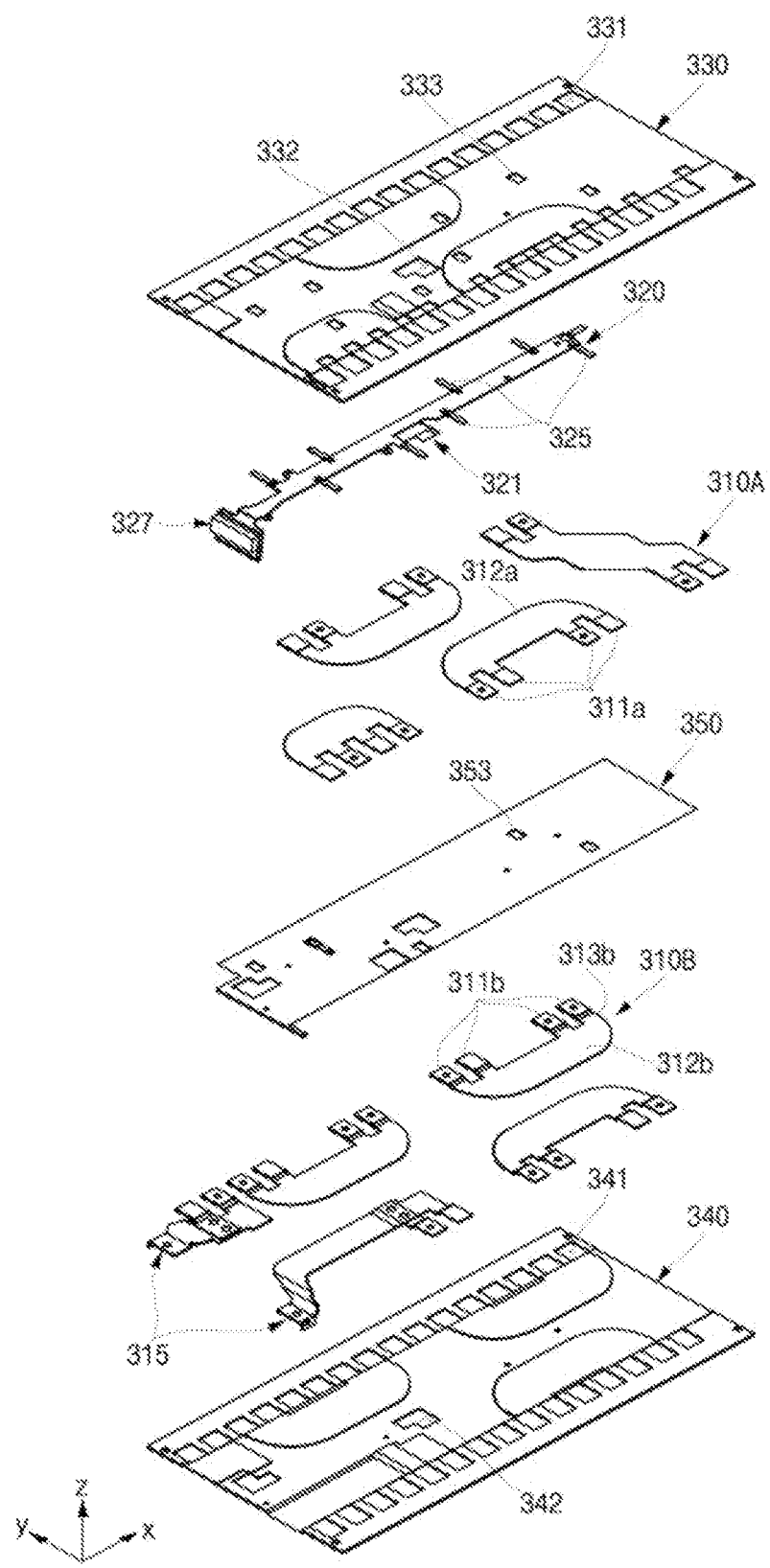
FIG. 5 is an exploded perspective view of the busbar assembly of FIG. 4.
Figure 6:
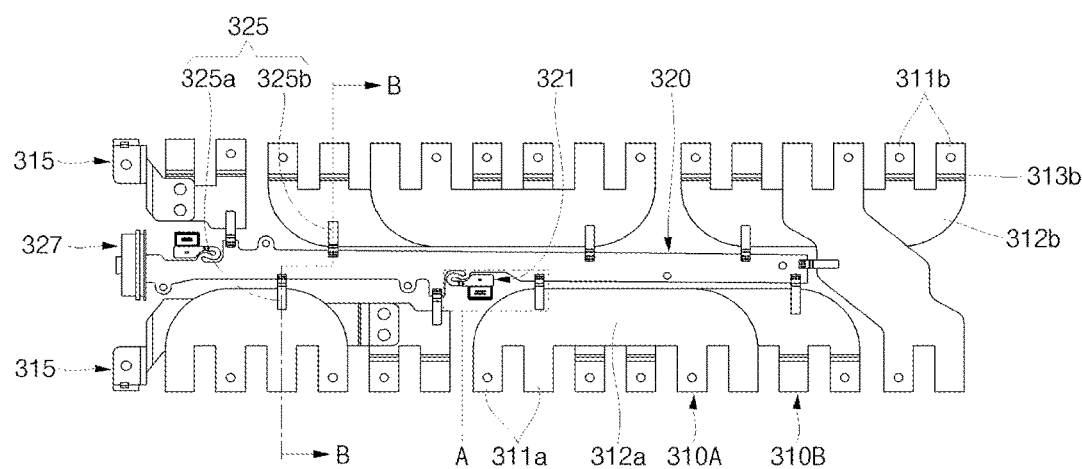
FIG. 6 is a plan view of a state in which the busbar of FIG. 5 and a flexible substrate are combined.
Figure 7:
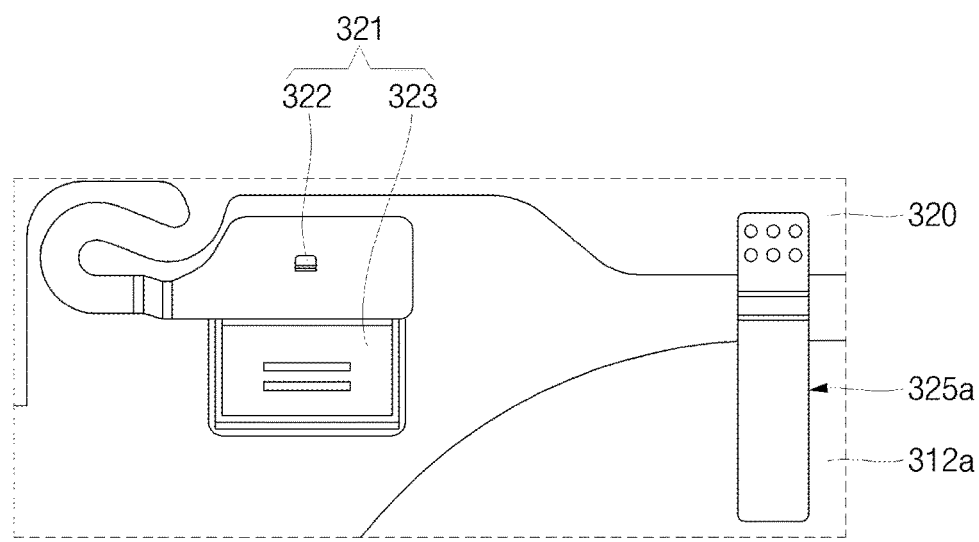
FIG. 7 is an enlarged view of portion A of FIG. 6.
Figure 8:
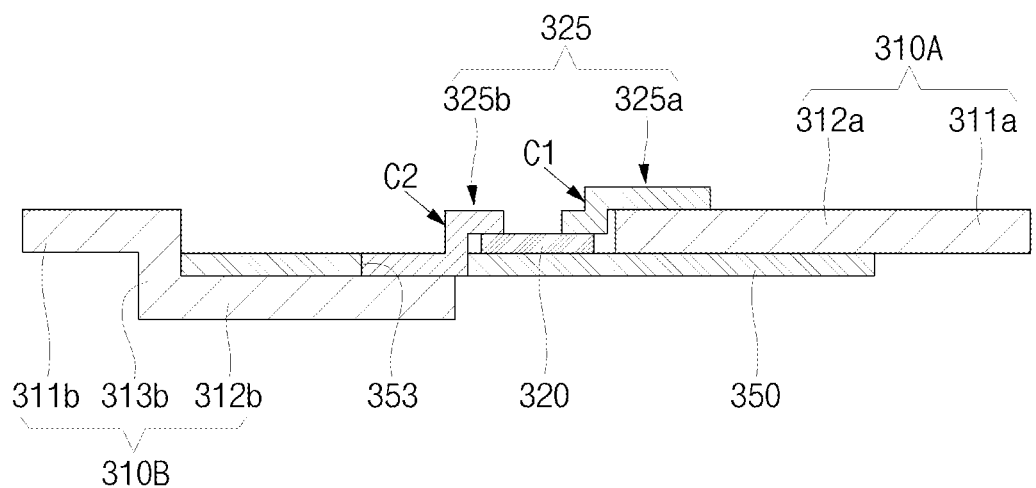
FIG. 8 is a cross-sectional view taken along line B-B of FIG. 6.

FIG. 4 is a perspective view of a busbar assembly according to another embodiment of the present disclosure. FIG. 5 is an exploded perspective view of the busbar assembly of FIG. 4. FIG. 6 is a plan view of a state in which the busbar of FIG. 5 and a flexible substrate are combined. FIG. 7 is an enlarged view of portion A of FIG. 6. FIG. 8 is a cross-sectional view taken along line B-B of FIG. 6.

Referring to FIGS. 4 to 8, a busbar assembly 300 may include busbars 310A and 310B, a flexible substrate 320, a first insulation film 330, a second insulation film 340, and a third insulation film 350. In some examples, as compared to the busbar assembly 200 of FIG. 3, the busbar assembly 300 may further include the third insulation film 350. The third insulation film 350 may be positioned between the first insulation film 330 and the second insulation film 340.

The busbars 310A and 310B may electrically connect the plurality of battery cells 100 to each other. The busbars 310A and 310B may include a first busbar 310A positioned between the first insulation film 330 and the third insulation film 350, and a second busbar 310B positioned between the second insulation film 340 and the third insulation film 350. In other words, the busbars 310A and 310B may include the first busbar 310A positioned above the third insulation film 350 and the second busbar 310B positioned below the third insulation film 350.

The first busbar 310A may be located on the same plane between the first insulation film 330 and the third insulation film 350. In some examples, the first busbar 310A may include a body 312a and a connection part 311a extending to one side of the body 312a and electrically connected to the first terminal 120 and/or the second terminal 130 of the battery cell 100. The connection part 311a may be connected to at least two or more first terminals 120 and/or second terminals 130. Although FIG. 5 illustrates that the first busbar 310A includes four connection parts 311a, the first busbar 310A may include four or more connection parts 311a. In some examples, the body 312a of the first busbar 310A may be stacked to e.g., vertically, overlap a body 312b of the second busbar 310B, but the third insulation film 350 may be positioned between the body 312a of the first busbar 310A and the body 312b of the second busbar 310B to prevent a short circuit therebetween.

The second busbar 310B may be positioned between the third insulation film 350 and the second insulation film 340. In some examples, the second busbar 310B may include the body 312b, a connection part 311b extending to one side of the body 312b to be electrically connected to the first terminal 120 and/or the second terminal 130 of the battery cell 100, and a bent portion 313b located between the body 312b and the connection part 311b. The second busbar 310B may further include the bent portion 313b as compared with the first busbar 310A, e.g., the bent portion 313b may extend in the Z-axis to connect the connection part 311b to the body 312b.

The body 312b may be positioned between the third insulation film 350 and the second insulation film 340, and the connection part 311b may be positioned at a relatively higher position than the body 312b, e.g., along the Z-axis in FIG. 5. In other words, the second busbar 310B includes the bent portion 313b located between the body 312b and the connection part 311b, and thus the connection part 311b and the body 312b are not formed on the same plane, e.g., the connection part 311b and the body 312b with the bent portion 313b therebetween may have a step shape. Here, the connection part 311a of the first busbar 310A and the connection part 311b of the second busbar 310B may be formed on the same plane, e.g., while the body 312a of the first busbar 310A and the body 312b of the second busbar 310B may be formed on different planes. Accordingly, the busbar assembly 300 may be stably seated on the first terminal 120 and the second terminal 130 of the battery cell 100. In addition, the height of the bent portion 313b may correspond, e.g., equal, to the thickness of the third insulation film 350.

In some examples, an output terminal 315 for drawing out an output voltage of the battery pack 10 may be formed on the second busbar 310B. The output terminal 315 may be drawn out from the battery pack 10 in the same direction.

The flexible substrate 320 may be positioned between the first insulation film 330 and the third insulation film 350. The flexible substrate 320 may be formed similarly to the flexible substrate 220 of FIG. 3. The flexible substrate 320 may include a temperature measuring unit 321 for measuring the temperature of the battery cell 100 and a sensing plate 325 for measuring the voltage of the battery cell 100.

For example, as shown in FIG. 7, the temperature measuring unit 321 may include a temperature sensor 322, e.g., a thermistor, and a connection plate 323 welded to the battery cell 100. In some examples, the temperature sensor 322 may be attached to the flexible substrate 320 through soldering, and the connection plate 323 may be welded to the cap plate 150 of the battery cell 100 with a laser. In addition, as illustrate in FIG. 5, a connector 327 may be coupled to one end of the flexible substrate 320, and the flexible substrate 320 may be connected to an external system through the connector 327.

As illustrated in FIGS. 6 and 8, the sensing plate 325 may include a first sensing plate 325a electrically connected to the first busbar 310A and a second sensing plate 325b electrically connected to the second busbar 310B. One end of the first sensing plate 325a may be electrically connected to the flexible substrate 320 and the other end thereof may be electrically connected to the body 312a of the first busbar 310A. The flexible substrate 320 and the first busbar 310A are positioned on the third insulation film 350, and the first sensing plate 325a may include a bent portion (C1) according e.g., equal, to the thickness difference between the flexible substrate 320 and the first busbar 310A.

One end of the second sensing plate 325b may be electrically connected to the flexible substrate 320 and the other end thereof may be electrically connected to the body 312b of the second busbar 310B. The other end of the second sensing plate 325b may pass through the third insulation film 350 and may be electrically connected to the body 312b of the second busbar 310B. Since the flexible substrate 320 is located on the upper portion of the third insulation film 350 and the body 312a of the second busbar 310B is located on the lower portion of the third insulation film 350, the second sensing plate 325b may include a bent portion C2 according, e.g., equal, to the height difference between the flexible substrate 320 and the second busbar 310B. In addition, since the third insulation film 350 is positioned between the flexible substrate 320 and the second busbar 310B, the height of the bent portion C2 of the second sensing plate 325b may be larger than the height of the bent portion C1 of the first sensing plate 325a, e.g., along the Z-axis in FIG. 5.

The first insulation film 330 may cover the first busbar 310A and the flexible substrate 320 located on the third insulation film 350. The second insulation film 340 may cover the second busbar 310B located under the third insulation film 350. In some examples, the first insulation film 330 and the second insulation film 340 may complete the busbar assembly 300 by laminating the busbars 310A and 310B and the flexible substrate 320 located on the upper and lower portions of the third insulation film 350. In some examples, after the busbars 310A and 310B, the flexible substrate 320, and the third insulation film 350 are positioned between the first insulation film 330 and the second insulation film 340, the first insulation film 330 and the second insulation film 340 may be thermally fused, e.g., as discussed previously with reference to the busbar assembly 200 in FIG. 3, thereby forming the busbar assembly 300.

The first insulation film 330 and the second insulation film 340 may be formed to have the same size (e.g., area), and the third insulation film 350 may be formed to have a smaller size (e.g., area) than, e.g., each of, the first and second insulation films 330 and 340, e.g., the third insulation film 350 may have a shorter length and a shorter width in the respective X-axis and Y-axis than each of the first and second insulation films 330 and 340. The first insulation film 330 and the second insulation film 340 may include terminal holes 331 and 341 formed at positions corresponding to, e.g., overlapping, the first terminal plate 124 and the second terminal plate 134 of the battery cell 100, respectively. The first insulation film 330 may include a first hole 332 exposing the temperature measuring unit 321 and a second hole 333 exposing a portion of the sensing plate 325 for measuring a voltage. The second insulation film 340 may include a first hole 342 exposing the temperature measuring unit 321.

The third insulation film 350 may be positioned between the first insulation film 330 and the second insulation film 340, and may insulate the first busbar 310A and the second busbar 310B from each other. In some examples, the third insulation film 350 may be referred to as a flame retardant barrier (FRB), a flame retardant film, or a flame retardant sheet. For example, the third insulation film 350 may include a flame retardant material. The third insulation film 350 may be formed to have a smaller size (e.g., area) than the first and second insulation films 330 and 340, and may cover the bodies 312a and 312b of the busbars 310A and 310B and may expose connection parts 311a and 311b. The third insulation film 350 may include a through-hole 353 exposing a portion of the second sensing plate 325b. The through-hole 353 may be formed at a position corresponding to the second hole 333 of the first insulation film 330.

By way of summation and review, embodiments provide a battery pack with improved busbar coupling structure, thereby improving energy density by lowering a height of the battery pack. That is, as described above, the battery pack according to embodiments includes a busbar assembly having a busbar and a flexible substrate that are laminated with an insulation film, thereby lowering a height of the battery pack to improve energy density. In addition, the laminated structure of the busbar assembly eliminates the need of a separate busbar holder or support member, thereby reducing costs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery pack, comprising:
   battery cells arranged in a first direction; and
   a busbar assembly coupled to upper portions of the battery cells, the busbar assembly including:
   a busbar electrically connected to the battery cells,
   a flexible substrate configured to measure a state information of the battery cells, the flexible substrate including:
   a temperature measurer configured to measure a temperature of the battery cells, and
   a sensing plate configured to measure a voltage of the battery cells, and
   an insulating film surrounding the busbar and the flexible substrate, the insulating film including:
   a first insulation film on an upper portion of the busbar and the flexible substrate, and a second insulation film on a lower portion of the busbar and the flexible substrate,
wherein each of the first insulation film and the second insulation film includes a first hole exposing the temperature measurer.

2. The battery pack as claimed in claim 1, wherein:
the busbar includes a body and a connection part extending to one side of the body, the connection part being coupled to an electrode terminal of a corresponding one of the battery cells, and
each of the first insulation film and the second insulation film includes a terminal hole exposing the connection part.

3. The battery pack as claimed in claim 1, wherein the first insulation film includes a second hole exposing a portion of the sensing plate.

4. The battery pack as claimed in claim 1, further comprising a third insulation film between the first insulation film and the second insulation film.

5. The battery pack as claimed in claim 4, wherein the busbar includes:
a first sub-busbar between the first insulation film and the third insulation film, and
a second sub-busbar between the third insulation film and the second insulation film.

6. The battery pack as claimed in claim 5, wherein:
each of the first sub-busbar and the second sub-busbar includes a body and a connection part extending to one side of the body, the connection part being coupled to an electrode terminal of a corresponding one of the battery cells, and
the second sub-busbar further includes a bent portion between the body and the connection part.

7. The battery pack as claimed in claim 6, wherein a height of the bent portion is equal to a thickness of the third insulation film.

8. The battery pack as claimed in claim 6, wherein the third insulation film has a smaller area than that of each of the first insulation film and the second insulation film, the third insulation film being between the body of the first sub-busbar and the body of the second sub-busbar.

9. The battery pack as claimed in claim 6, wherein the connection part of the first sub-busbar and the connection part of the second sub-busbar are on a same plane.

10. The battery pack as claimed in claim 6, wherein the sensing plate has a first sensing plate electrically connected to the first sub-busbar and a second sensing plate electrically connected to the second sub-busbar.

11. The battery pack as claimed in claim 10, wherein the third insulation film includes a through-hole exposing a portion of the second sensing plate.

12. The battery pack as claimed in claim 11, wherein the second sensing plate is electrically connected to the body of the second sub-busbar through the through-hole.

13. The battery pack as claimed in claim 10, wherein a bent portion of the second sensing plate has a larger height than a bent portion of the first sensing plate.

* * * * *